(12) United States Patent
Yachi et al.

(10) Patent No.: US 11,846,025 B2
(45) Date of Patent: Dec. 19, 2023

(54) SUBSTRATE PROCESSING APPARATUS CAPABLE OF ADJUSTING INNER PRESSURE OF PROCESS CHAMBER THEREOF AND METHOD THEREFOR

(71) Applicant: KOKUSAI ELECTRIC CORPORATION, Tokyo (JP)

(72) Inventors: Masamichi Yachi, Toyama (JP); Takayuki Nakada, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 123 days.

(21) Appl. No.: 16/985,785

(22) Filed: Aug. 5, 2020

(65) Prior Publication Data
US 2021/0040619 A1    Feb. 11, 2021

(30) Foreign Application Priority Data

Aug. 6, 2019  (JP) ................................ 2019-144877
Jul. 8, 2020   (JP) ................................ 2020-117977

(51) Int. Cl.
*C23C 16/52*  (2006.01)
*C23C 16/44*  (2006.01)
*H01L 21/67*  (2006.01)

(52) U.S. Cl.
CPC .......... *C23C 16/52* (2013.01); *C23C 16/4408* (2013.01); *C23C 16/4412* (2013.01);
(Continued)

(58) Field of Classification Search
None
See application file for complete search history.

(56) References Cited

U.S. PATENT DOCUMENTS 5,365,772 A * 11/1994 Ueda ...................... G01M 3/226
                                                        118/725
5,415,585 A     5/1995 Miyagi
(Continued)

FOREIGN PATENT DOCUMENTS

JP   03-164581 A2   7/1991
JP   07-058032 A    3/1995
(Continued)

OTHER PUBLICATIONS

Korean Office Action dated Jan. 24, 2022 for Korean Patent Application No. 10-2020-0094132.
(Continued)

*Primary Examiner* — Binu Thomas
(74) *Attorney, Agent, or Firm* — Volpe Koenig

(57) ABSTRACT

Described herein is a technique capable of adjusting an inner pressure of a process chamber into a high vacuum state in a short time. According to one aspect of the technique, there is provided a substrate processing apparatus including: a process chamber; a main exhaust line including a first pipe, a first opening degree adjusting valve, an opening/closing valve and a pressure sensor; a bypass exhaust line including a second pipe and a second opening degree adjusting valve; and a controller configured to adjust an inner pressure of the process chamber by: (a) adjusting an opening degree of the second opening degree adjusting valve; (b) closing the second opening degree adjusting valve and opening the opening/closing valve and the first opening degree adjusting valve; and (c) closing the opening/closing valve and the first opening degree adjusting valve and adjusting the opening degree of the second opening degree adjusting valve.

9 Claims, 6 Drawing Sheets

(52) U.S. Cl.
CPC .. *H01L 21/67017* (2013.01); *H01L 21/67253* (2013.01); *H01L 21/67276* (2013.01)

(56) References Cited

U.S. PATENT DOCUMENTS

| | | | | |
|---|---|---|---|---|
| 5,777,300 | A * | 7/1998 | Homma | H01L 21/67115 118/724 |
| 6,139,642 | A * | 10/2000 | Shimahara | C23C 16/4412 118/724 |
| 6,936,108 | B1 * | 8/2005 | Saito | C23C 16/4412 118/724 |
| 2004/0007186 | A1 * | 1/2004 | Saito | H01L 21/67253 118/724 |
| 2009/0258504 | A1 * | 10/2009 | Nakaiso | C23C 16/4412 118/724 |
| 2014/0356550 | A1 * | 12/2014 | Tonegawa | C23C 16/4412 118/723 R |
| 2017/0183770 | A1 * | 6/2017 | Komae | C23C 16/4412 |

FOREIGN PATENT DOCUMENTS

| | | |
|---|---|---|
| JP | 08-283946 A | 10/1996 |
| JP | 11-300193 A | 11/1999 |
| JP | H11300193 * | 11/1999 |
| JP | 2007-227805 A | 9/2007 |
| JP | 2008-153695 A | 7/2008 |
| JP | 2015-183985 A | 10/2015 |
| KR | 10-0251876 B1 | 4/2000 |
| KR | 10-0636436 B1 | 10/2006 |
| TW | 202029306 A | 8/2020 |
| WO | 2016/052200 A1 | 4/2016 |

OTHER PUBLICATIONS

Taiwan Office Action dated Jan. 7, 2022 for Taiwan Patent Application No. 109126304.
Singapore Office Action dated May 25, 2021 for Singapore Patent Application No. 10202007254W.
Korean Office Action dated Sep. 21, 2023 for Korean Patent Application No. 10-2023-0116999.

* cited by examiner

SUBSTRATE PROCESSING APPARATUS CAPABLE OF ADJUSTING INNER PRESSURE OF PROCESS CHAMBER THEREOF AND METHOD THEREFOR

CROSS-REFERENCE TO RELATED PATENT APPLICATION

This non-provisional U.S. patent application claims priority under 35 U.S.C. § 119 of Japanese Patent Application No. 2019-144877, filed on Aug. 6, 2019, and Japanese Patent Application No. 2020-117977, filed on Jul. 8, 2020, the entire contents of which are hereby incorporated by reference.

BACKGROUND

1. Field

The present disclosure relates to a substrate processing apparatus and a non-transitory computer-readable recording medium.

2. Related Art

In manufacturing processes of a semiconductor device, a substrate processing apparatus of a vertical type may be used as an apparatus of performing a substrate processing on a semiconductor substrate (hereinafter, also simply referred to as a "substrate") serving as an object to be processed including the semiconductor. In particular, according to some related arts, in a substrate processing apparatus configured to perform the substrate processing under a reduced pressure, a main exhaust line is provided across an exhauster such as a pump, an opening/closing valve and an APC (Automatic Pressure Control) valve are provided at the main exhaust line, a bypass exhaust line including an opening/closing valve and bypassing the opening/closing valve of the main exhaust line is provided, and the APC valve is provided on both the main exhaust line and the bypass exhaust line.

According to some related arts described above, by providing the APC valve at the bypass exhaust line, it is possible to gradually reduce an inner pressure of a reaction chamber from atmospheric pressure to a predetermined pressure so that particles (for example, quartz) in the reaction chamber are prevented from diffusing due to a pressure difference between the reaction chamber and a turbo molecular pump serving as the exhauster.

However, since a diameter of a pipe of the bypass exhaust line described above is considerably smaller than a diameter of a pipe of the main exhaust line described above, it may take time to reduce the inner pressure of the reaction chamber from the atmospheric pressure to the predetermined pressure. On the other hand, recently, as the substrate processing, a film-forming process in which a process chamber (that is, the reaction chamber) is in a higher vacuum state as compared with a conventional process may be performed.

SUMMARY

Described herein is a technique capable of bring an inner pressure of a process chamber into a high vacuum state in a short time without diffusing particles in the process chamber.

According to one aspect of the technique of the present disclosure, there is provided a substrate processing apparatus including: a process chamber in which a substrate is processed; a main exhaust line including: a first pipe configured to discharge the gas from the process chamber; a first opening degree adjusting valve provided at the first pipe; an opening/closing valve provided at the first pipe; and a pressure sensor provided at the first pipe and configured to detect an inner pressure of the process chamber; a bypass exhaust line including: a second pipe connected to the main exhaust line; and a second opening degree adjusting valve provided at the second pipe; and a controller configured to adjust the inner pressure of the process chamber to a process pressure by performing: (a) reducing the inner pressure of the process chamber to a first pressure by adjusting an opening degree of the second opening degree adjusting valve based on information from the pressure sensor; (b) reducing the inner pressure of the process chamber to a second pressure by closing the second opening degree adjusting valve and opening the opening/closing valve and the first opening degree adjusting valve when the inner pressure of the process chamber reaches the first pressure; and (c) adjusting the inner pressure of the process chamber to the process pressure by closing the opening/closing valve and the first opening degree adjusting valve and adjusting the opening degree of the second opening degree adjusting valve when the inner pressure of the process chamber reaches the second pressure.

DETAILED DESCRIPTION

Figure 1:
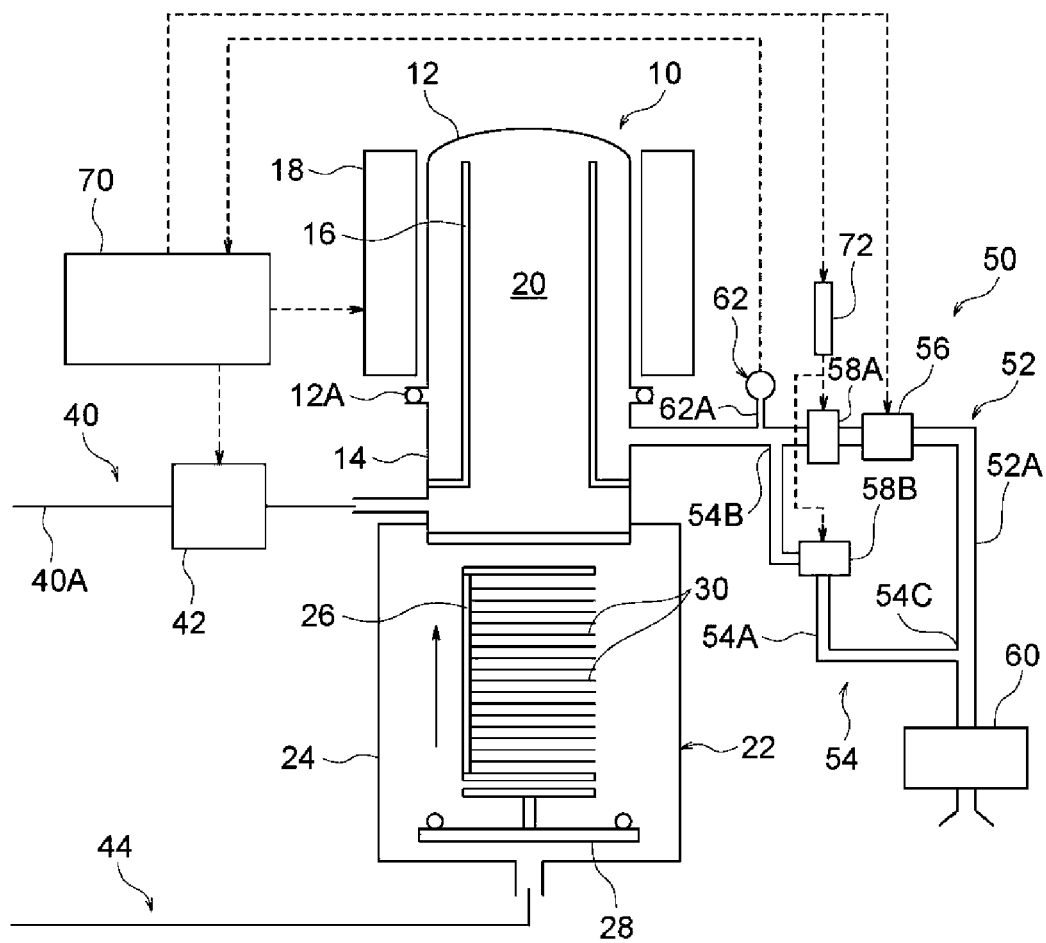
FIG. 1 schematically illustrates an overall configuration of a substrate processing apparatus according to one or more embodiments described herein.

Hereinafter, one or more embodiments (also simply referred to as "embodiments") according to the technique of the present disclosure will be described with reference to the drawings. In the drawings, the same or equivalent constituents are designated by the same reference numerals. In addition, dimensional ratios in the drawings may be exaggerated for convenience of explanation, and may differ from the actual ratios. An upper direction of each drawing will be referred to as "upper" or "upper portion", and a lower direction of each drawing will be referred to as "lower" or "lower portion" in the following description. Further, each pressure described in the present embodiments may refer to a gas pressure.

<Overall Configuration of Substrate Processing Apparatus>

As shown in FIG. 1, a substrate processing apparatus 100 according to the present embodiments includes: a reaction furnace (which is a process furnace) 10 including a process chamber 20 in which a substrate 30 is processed; a spare chamber 22 including a boat 26 configured to transfer the substrate 30 to the process chamber 20; a gas introduction line (which is a gas introduction system) 40 configured to introduce a gas into the process chamber 20; an exhaust system 50 configured to discharge (exhaust) the gas in the process chamber 20 from the process chamber; and a main controller 70 configured to control operations of the substrate processing apparatus 100.

<Reaction Furnace>

As shown in FIG. 1, the process chamber 20 including a reaction tube 12 and a furnace opening flange 14 is provided in the reaction furnace 10. The reaction tube 12 is of a cylindrical shape, and an axis of the reaction tube 12 is provided in the vertical direction. The furnace opening flange 14 is of a cylindrical shape. The furnace opening flange 14 is connected to a lower portion of the reaction tube 12 via an airtight seal 12A interposed therebetween, and an axis of the furnace opening flange 14 is provided in the vertical direction. An inner tube 16 is supported in the reaction tube 12 of the reaction furnace 10 so as to be concentric with the reaction tube 12. A heater 18 is provided on an outer circumference of the reaction tube 12 so as to be concentric with the axis of the reaction tube 12 and spaced apart from an outer surface of the reaction tube 12. The heater 18 is configured to receive a signal from the main controller 70 described later to generate heat, and to heat the reaction tube 12. Thus, the reaction furnace 10 is constituted by the reaction tube 12, the furnace opening flange 14, the inner tube 16, the heater 18 and the process chamber 20. The substrate 30 may be accommodated in the process chamber 20.

<Spare Chamber>

As shown in FIG. 1, the spare chamber 22 includes a transfer housing 24 airtightly communicating with a lower portion of the furnace opening flange 14. The boat 26 is provided in the transfer housing 24 so as to be vertically movable. The boat 26 accommodating the substrate 30 may be transported and inserted (that is, loaded) into the process chamber 20. A second gas introduction line (which is a second gas introduction system) 44 of the same configuration as the gas introduction line 40 described later in detail may be connected to a lower portion of the transfer housing 24 such that the gas introduced into the process chamber 20 may be introduced through the second gas introduction line 44. In addition, a furnace opening lid 28 configured to airtightly close the transfer housing 24 is provided below the boat 26 and the transfer housing 24.

<Gas Introduction Line>

As shown in FIG. 1, the gas introduction line 40 includes: a gas supplier (which is a gas supply system, not shown); a gas introduction pipe 40A connecting the gas supplier and the furnace opening flange 14; and a flow rate controller 42 provided at the gas introduction pipe 40A between the gas supplier and the furnace opening flange 14. The flow rate controller 42 is configured to control an amount of the gas introduced by the gas introduction line 40 (also referred to as a "gas introduction amount") by opening and closing a valve (not shown) provided in the flow rate controller 42 in accordance with a signal from the main controller 70 described later. The second gas introduction line 44 is of the same configuration as the gas introduction line 40 except that the gas supplier of the second gas introduction line 44 and the lower portion of the transfer housing 24 communicate with each other. The second gas introduction line 44 is provided as a backup of the gas introduction line 40. For example, the gas used in the present embodiments includes an inert gas, and specifically, a nitrogen gas.

<Main Controller>

The main controller 70 is configured to control the overall operation of the substrate processing apparatus 100. The main controller 70 may be embodied by a computer that includes components such as a CPU (central processing unit), a ROM (Read Only Memory), a RAM (Random Access Memory), a storage device, an input device, a display and a communication interface, which are not shown in the drawings. Each component of the computer described above is connected to a bus of the computer. Based on information inputted from the input device, the main controller 70 executes a substrate processing program configured to perform various processes in the substrate processing apparatus 100. For example, the main controller 70 executes a process recipe (which is one of substrate processing programs) to control a substrate processing (which is a part of manufacturing processes of a semiconductor device). When controlling the substrate processing, the main controller 70 is configured to control an opening/closing operation of a gate valve 56 of the exhaust system 50. In addition, in cooperation with an APC controller 72 described later, the main controller 70 is configured to control an inner pressure of the process chamber 20 by adjusting opening degrees of a first APC valve 58A and a second APC valve 58B described later. According to the present embodiments, the main controller 70 is an example of a controller, and the APC controller 72 described later is an example of the controller. That is, the controller may be constituted by the main controller 70 and the APC controller 72. Hereinafter, the description "the APC valve is closed" means that the opening degree of the APC valve is 0%, and the description "the APC valve is open" means that the opening degree of the APC valve is 100%.

<Exhaust System>

Figure 2:
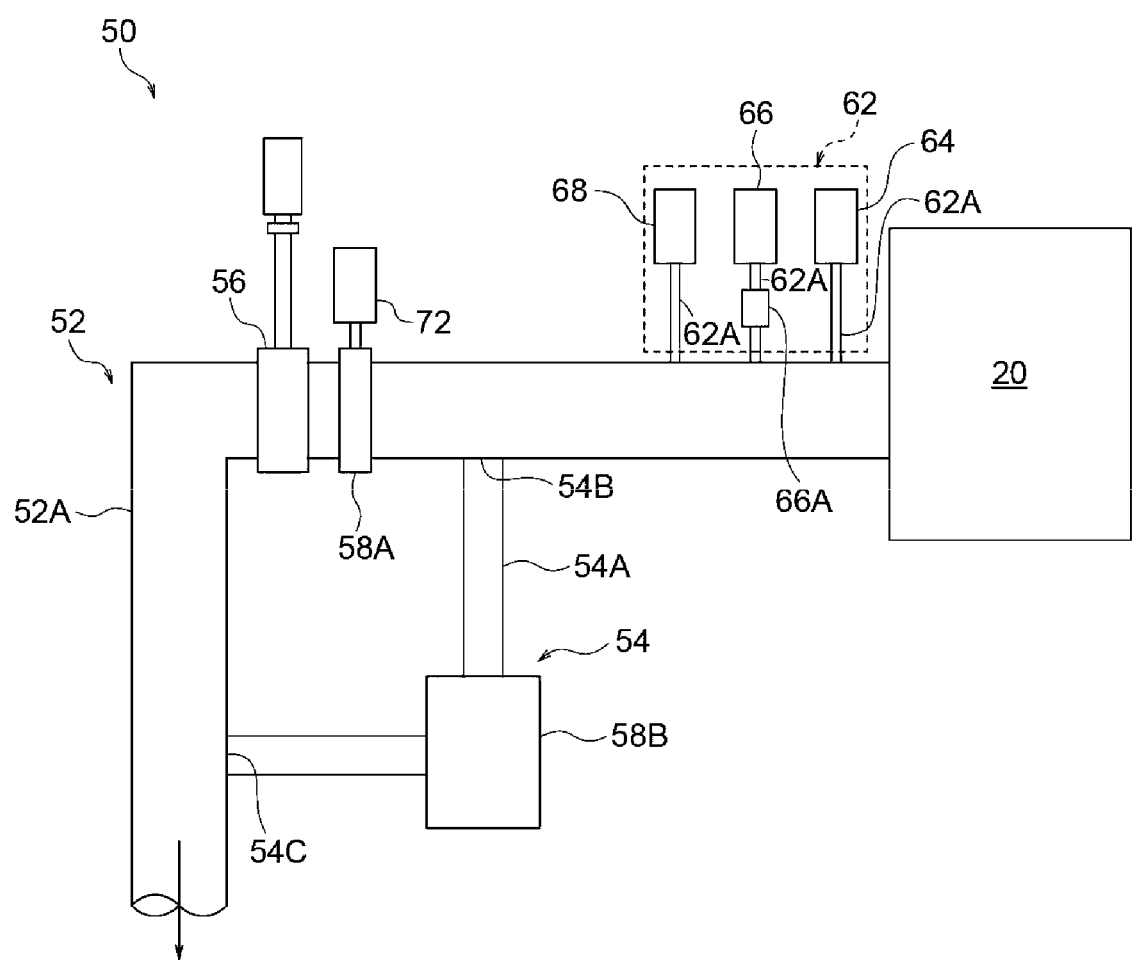
FIG. 2 schematically illustrates an exhaust system of the substrate processing apparatus according to the embodiments described herein.
Figure 3:
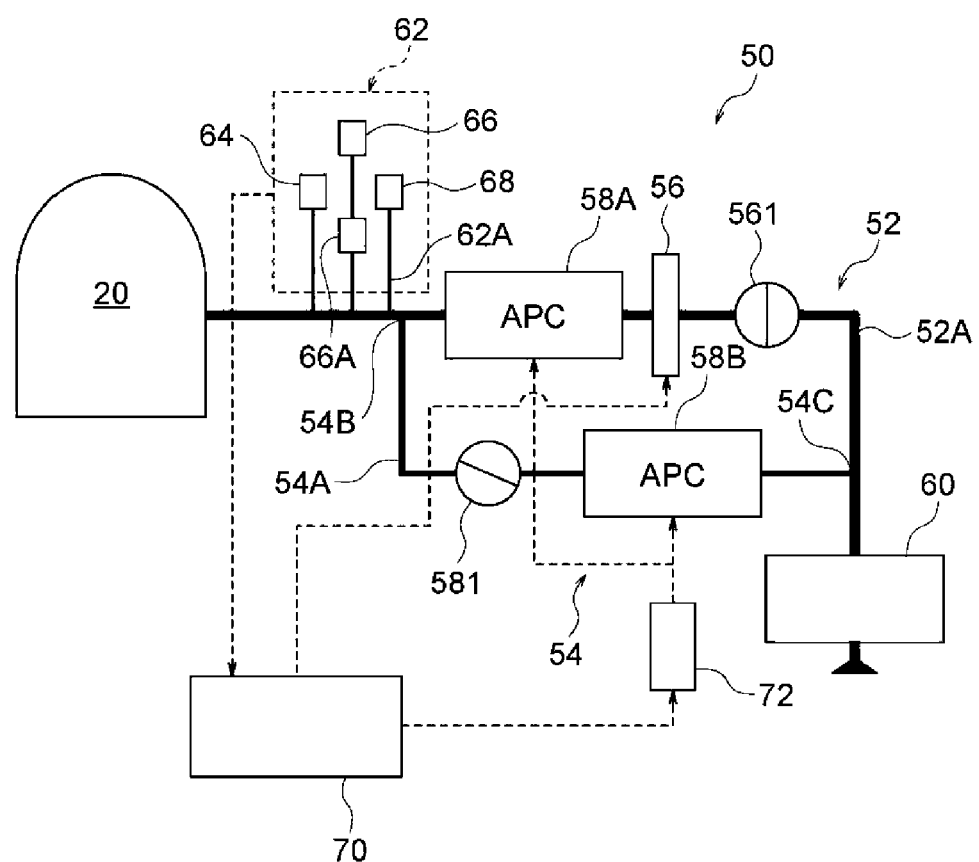
FIG. 3 schematically illustrates an exemplary operation of reducing a pressure from atmospheric pressure to a first pressure by the exhaust system according to the embodiments described herein and an exemplary operation of reducing the pressure from a second pressure to a high vacuum range by the exhaust system according to the embodiments described herein.

As shown in FIGS. 1 through 3, the exhaust system 50 includes a main exhaust line (which is a main exhaust system) 52 and a bypass exhaust line (which is a bypass exhaust system) 54. The main exhaust line 52 includes: a large-diameter pipe 52A serving as a first pipe configured to discharge the gas from the process chamber 20; the first APC valve 58A and the gate valve 56 provided at the pipe 52A; and a pressure sensor group 62 provided at the pipe 52A and configured to detect the inner pressure of the process chamber 20. The bypass exhaust line 54 at least includes: a pipe 54A connected to the pipe 52A and serving as a second pipe; and the second APC valve 58B provided at the pipe 54A. When a diameter of the pipe 52A is represented by "D", a diameter of the pipe 54A is equal to "D×(0.5 to 0.9)". That is, the diameter of the pipe 54A is less than that of the pipe 52A. According to the present embodiments, the gate valve 56 is an example of an opening/closing valve, the first APC valve 58A is an example of a first opening degree adjusting valve, and the second APC valve 58B is an example of a second opening degree adjusting valve. One end of the main exhaust line 52 serving as a stream end opposite to the process chamber 20 is connected to a suction side of a pump 60. The exhaust system 50 may further include the pump 60.

The exhaust system 50 is controlled by the APC controller 72 controlling the first APC valve 58A and the second APC valve 58B and the main controller 70.

\<Main Exhaust Line\>

As shown in FIG. 1, the pipe 52A, via which the process chamber 20 communicates with the pump 60, and the first APC valve 58A and the gate valve 56 disposed between the process chamber 20 and the pump 60 are provided at the main exhaust line 52. The gate valve 56 is electrically connected to the main controller 70. The gate valve 56 is opened or closed (that is, the opening/closing operation of the gate valve 56 is performed) based on a signal from the main controller 70 electrically connected to the pressure sensor group 62 described later. The first APC valve 58A is electrically connected to the APC controller 72, and an opening/closing operation and an opening degree adjusting operation of the first APC valve 58A are performed based on a signal from the APC controller 72 electrically connected to the pressure sensor group 62 described later. The main exhaust line 52 is configured to exhaust the gas in the process chamber 20 from the process chamber 20 by a suction operation of the pump 60 when the first APC valve 58A and the gate valve 56 are open. According to the present embodiments, for example, the diameter of the pipe 52A is 200 mm (200 Φ).

\<Bypass Exhaust Line\>

As shown in FIG. 1, the pipe 54A, via which a branch portion 54B communicates with a confluence portion 54C, and the second APC valve 58B disposed at the pipe 54A between the branch portion 54B and the confluence portion 54C are provided at the bypass exhaust line 54. The branch portion 54B where the pipe 54A is branched off from the pipe 52A is provided at the pipe 52A between the process chamber 20 and the gate valve 56. The confluence portion 54C where the pipe 54A joins the pipe 52A again is provided at the pipe 52A between the gate valve 56 and the pump 60. The second APC valve 58B is electrically connected to the APC controller 72, and an opening/closing operation of the second APC valve 58B is performed while adjusting the opening degree of the second APC valve 58B based on an operation signal (which is an operation command) from the APC controller 72. The APC controller 72 is configured to receive pressure information of the process chamber 20 from the main controller 70 electrically connected to the pressure sensor group 62 described later, and configured to generate the operation signal. The bypass exhaust line 54 is configured to exhaust the gas in the process chamber 20 by the suction operation of the pump 60 when the gate valve 56 is closed. The diameter of the pipe 54A is 40 mm or more and 180 mm or less, preferably, 80 mm or more and 140 mm or less, and more preferably, 80 mm or more and 100 mm or less (80Φ or more and 100Φ or less). According to the present embodiments, for example, the diameter of the pipe 54A is 100 mm (100Φ). As long as the diameter of the pipe 54A of the bypass exhaust line 54 is smaller than the diameter of the pipe 52A of the main exhaust line 52, the diameter of the pipe 54A may be greater than 180 mm. However, when the diameter of the pipe 54A is too large, there is no need to provide the bypass exhaust line 54. In addition, when the diameter of the pipe 54A is greater than 140 mm, particles may be generated during the exhaust process from the atmospheric pressure described later, despite the adjustment of the APC valve such as the second APC valve 58B. On the other hand, when the diameter of the pipe 54A is too small, an exhaust capacity of an exhaust line such as the bypass exhaust line 54 may adversely affect the substrate processing. For example, when the diameter of the pipe 54A is 40 mm or less, the exhaust capacity may adversely affect the substrate processing.

\<Pressure Sensor Group\>

As shown in FIG. 1, the pressure sensor group 62 is provided so as to communicate with each other by a plurality of pipes 62A. The plurality of the pipes 62A are connected to the pipe 52A at a portion adjacent to the branch portion 54B of the pipe 52A and between the process chamber 20 and the branch portion 54B. The pressure sensor group 62 is electrically connected to the main controller 70, and is configured to transmit the pressure information of the process chamber 20. As described later, the pressure sensor group 62 is constituted by an atmospheric pressure sensor 64, a first vacuum sensor 68 and a second vacuum sensor 66, which are described later. As shown in FIG. 2, the first vacuum sensor 68, the second vacuum sensor 66 and the atmospheric pressure sensor 64 are sequentially provided in this order at the plurality of the pipes 62A connected to the pipe 52A, respectively. The plurality of the pipes 62A are connected to the pipe 52A sequentially away from the branch portion 54B toward the process chamber 20. According to the present embodiments, each of the atmospheric pressure sensor 64, the first vacuum sensor 68 and the second vacuum sensor 66 is an example of a pressure sensor.

\<Atmospheric Pressure Sensor\>

As shown in FIG. 2, the atmospheric pressure sensor 64 is provided at one of the pipes 62A closest to the process chamber 20 among the plurality of the pipes 62A connected to the pipe 52A, and is configured to detect a pressure within a range close to the atmospheric pressure.

\<First Vacuum Sensor\>

As shown in FIG. 2, the first vacuum sensor 68 is provided at one of the pipes 62A, and serves as a wide-range pressure sensor capable of detecting a pressure ranging from a pressure level close to the atmospheric pressure to a predetermined vacuum level ($10^{-1}$ Pa to $10^5$ Pa). According to the present embodiments, for example, the first vacuum sensor 68 is configured to detect the pressure within a range from the atmospheric pressure to a second pressure P2 (for example, 10 Torr).

\<Second Vacuum Sensor\>

As shown in FIG. 2, the second vacuum sensor 66 is provided at the pipe 62A. The second vacuum sensor 66 is provided with a valve 66A. The valve 66A is opened when the pressure is reduced to a predetermined pressure. According to the present embodiments, for example, the valve 66A is configured to be opened when the pressure is at the second pressure P2. The second vacuum sensor 66 serves as a pressure sensor capable of detecting the pressure in a high vacuum range (high vacuum state). According to the present embodiments, for example, the valve 66A is opened at the second pressure P2 (for example, 10 Torr) so that the second vacuum sensor 66 can detect the pressure.

As described above, each of the atmospheric pressure sensor 64, the first vacuum sensor 68 and the second vacuum sensor 66 is electrically connected to the main controller 70.

\<APC Controller\>

As shown in FIGS. 1 and 2, the APC controller 72 is provided at the pipe 52A of the main exhaust line 52 between the gate valve 56 and the pipe 62A or between the gate valve 56 and the branch portion 54B. The APC controller 72 is electrically connected to the main controller 70 and the APC controller 72. As described above, the APC controller 72 is configured to receive the pressure information of the process chamber 20 from the main controller 70, and is configured to adjust the opening degrees of the first APC valve 58A and the second APC valve 58B. As described above, according to the present embodiments, the APC controller 72 is an example of the controller.

<Operation of Exhaust System>

Hereinafter, operations and procedures of the substrate processing apparatus, a method of manufacturing the semiconductor device and the substrate processing program (or a non-transitory computer-readable recording medium) by the exhaust system 50 will be described with reference to FIGS. 3 through 6.

According to the present embodiments, for example, the exhaust system 50 is configured to reduce the inner pressure of the process chamber 20 by adjusting the opening degree of the second APC valve 58B by the main controller and the APC controller 72 based on the information from the pressure sensor group 62 such that the inner pressure of the process chamber 20 reaches the first pressure P1. When the inner pressure of the process chamber 20 reaches the first pressure P1, the exhaust system 50 is configured to reduce the inner pressure of the process chamber 20 by closing the second APC valve 58B and opening the first APC valve 58A and the gate valve 56 such that the inner pressure of the process chamber 20 reaches the second pressure P2. When the inner pressure of the process chamber 20 reaches the second pressure P2, the exhaust system 50 is configured to reduce the inner pressure of the process chamber 20 by closing the first APC valve 58A and the gate valve 56 and adjusting the opening degree of the second APC valve 58B such that the inner pressure of the process chamber 20 is reduced to a predetermined high vacuum state. According to the present embodiments, the pressure lower than the second pressure P2 is referred to as the "high vacuum state". In addition, the exhaust system 50 is configured to reduce the inner pressure of the process chamber 20 to the pressure lower than the second pressure P2 in the high vacuum range and to maintain a process pressure of processing the substrate 30.

Figure 5:
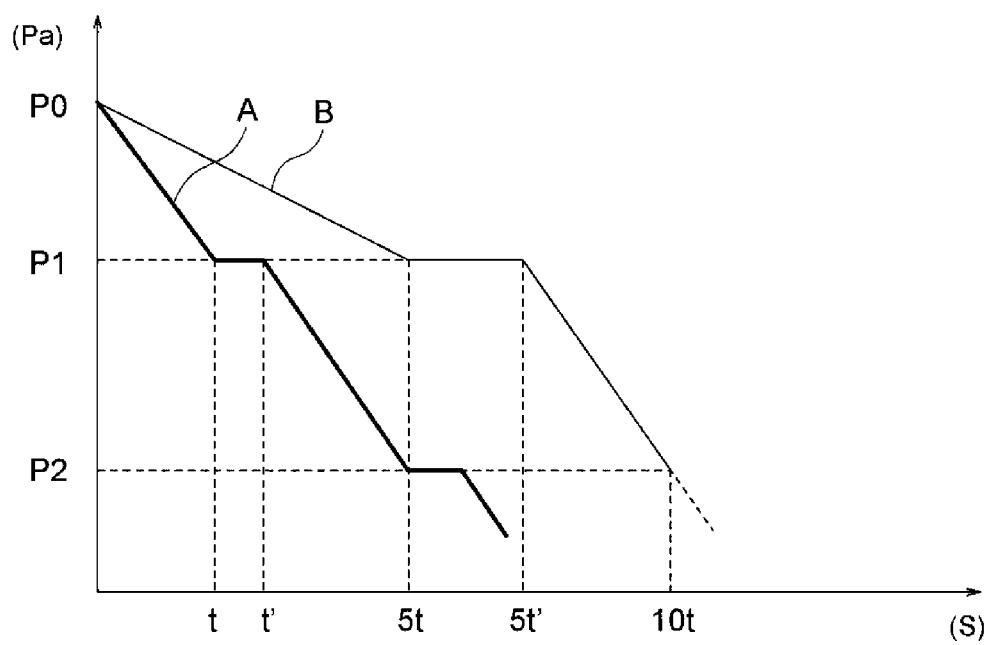
FIG. 5 is a graph schematically illustrating a pressure reduction state while operating the exhaust system according to the embodiments described herein.

A vertical axis shown in FIG. 5 represents the inner pressure of the process chamber 20, and a horizontal axis shown in FIG. 5 represents a pressure reduction time (i.e., an amount of time taken to complete pressure reduction). A pressure reduction line "A" according to the present embodiments is illustrated by a thick line in FIG. 5, and a pressure reduction line "B" according to a comparative example is illustrated by a thin line in FIG. 5. The atmospheric pressure P0 is about $1.023 \times 10^5$ Pa (about 760 Torr), the first pressure P1 is about $9.066 \times 10^4$ Pa (about 680 Torr), and the second pressure P2 is about $1.333 \times 10^3$ Pa (about 10 Torr). When reducing the inner pressure of the process chamber 20 from the atmospheric pressure, a slow exhaust is performed first. However, the slow exhaust actually takes a few seconds, which is negligible compared with the time of about 5 minutes to 10 minutes which would be taken for pressure change from the atmospheric pressure P0 to the second pressure P2. Therefore, in the present specification, the illustration of the slow exhaust is omitted in FIG. 5, and a description of the slow exhaust will be omitted below.

<Pressure Reduction from Atmospheric Pressure to First Pressure>

First, a step of reducing the inner pressure of the process chamber 20 from the atmospheric pressure P0 to the first pressure P1 at a predetermined rate is performed.

First, a plurality of substrates including the substrate 30 accommodated in the boat 26 are transferred and inserted into the process chamber 20 using the boat 26. When the plurality of the substrates are inserted into the process chamber 20 using the boat 26, the inner pressure of the process chamber 20 is set to the atmospheric pressure (Step S01). In the step S01, the first APC valve 58A, the gate valve 56 (also indicated by a reference numeral "561") and the second APC valve 58B (also indicated by a reference numeral "581") are closed.

Figure 6:
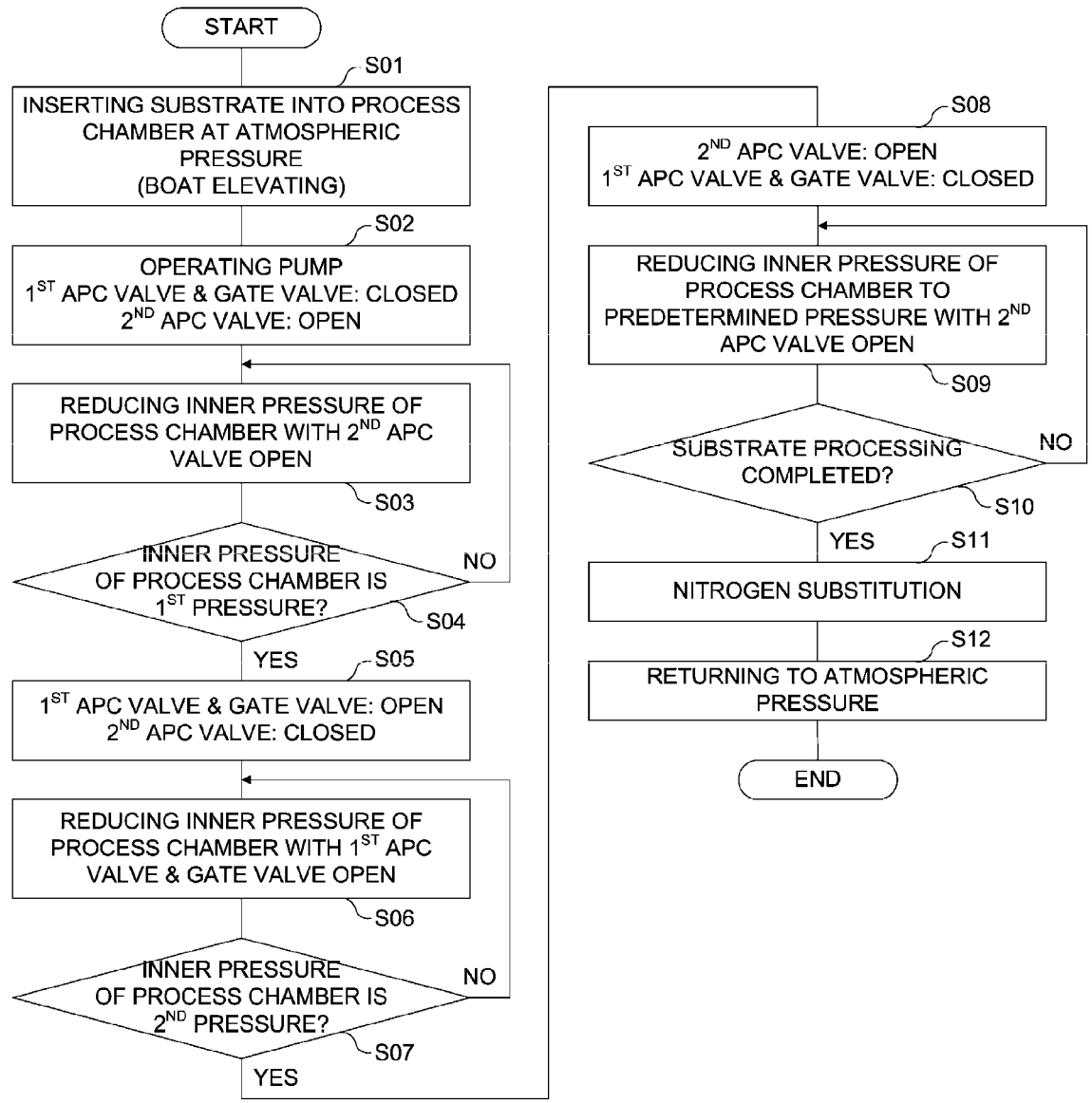
FIG. 6 is a flow chart schematically illustrating operations of the exhaust system according to the embodiments described herein.

As shown in FIGS. 3 and 6, the pump 60 is operated first. Subsequently, the first APC valve 58A and the gate valve 56 provided at the pipe 52A of the main exhaust line 52 are closed in response to a closing signal (which is a closing command) from the main controller 70. In FIG. 3, in order to facilitate the understanding, the gate valve 561 is additionally illustrated to indicate a closed state of the gate valve 56. In addition, the second APC valve 58B provided at the pipe 54A of the bypass exhaust line 54 is opened gradually from a closed state toward an open state by adjusting the opening degree of the second APC valve 58B in accordance with an opening signal (which is an opening command) from the APC controller 72. In FIG. 3, in order to facilitate the understanding, the APC valve 581 is additionally illustrated to indicate a state of the APC valve 58B shifting from the closed state toward the open state while its opening degree being adjusted (Step S02).

Then, the inner pressure of the process chamber 20 is reduced from the atmospheric pressure P0 toward the first pressure P1 while adjusting the opening degree of the second APC valve 58B (Step S03). According to the present embodiments, for example, since the diameter of the pipe 54A is 0.5 times to 0.9 times the diameter of the pipe 52A, the gas in the process chamber 20 is efficiently exhausted from the process chamber 20 as compared with the comparative example in which a thin pipe less than 0.5 times the diameter of the pipe 52A is used as the pipe 54A. In other words, the time (that is, the pressure reduction time) for reducing the inner pressure of the process chamber 20 from the atmospheric pressure P0 to the first pressure P1 is shortened (refer to the pressure reduction lines "A" and "B" in FIG. 5).

<Pressure Reduction from First Pressure to Second Pressure>

Subsequently, a step of reducing the inner pressure of the process chamber 20 from the first pressure P1 to the second pressure P2 is performed.

Before the inner pressure of the process chamber 20 is reduced from the first pressure P1 to the second pressure P2, the atmospheric pressure sensor 64 is turned off, the valve 66A of the second vacuum sensor 66 remains closed, and the first vacuum sensor 68 detects whether the inner pressure of the process chamber 20 is reduced to the first pressure P1 (Step S04). Information whether or not the inner pressure of the process chamber 20 is reduced to the first pressure P1 is transmitted to the main controller 70, and in turn, is transmitted from the main controller 70 to the APC controller 72.

Figure 4:
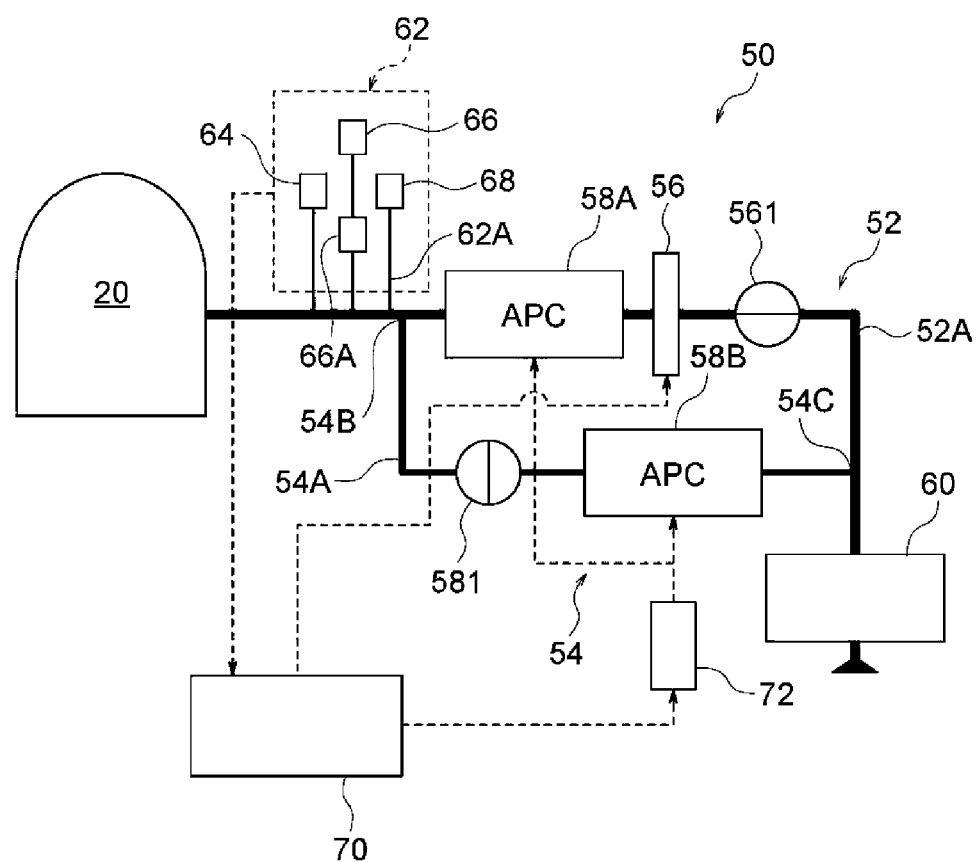
FIG. 4 schematically illustrates an exemplary operation of reducing the pressure from the first pressure to the second pressure by the exhaust system according to the embodiments described herein.

As shown in FIG. 4, when the inner pressure of the process chamber 20 is reduced to the first pressure P1, the first APC valve 58A and the gate valve 56 (561) are opened in response to the opening signal from the main controller 70. Simultaneously, the second APC valve 58B (581) is closed in response to the closing signal from the APC controller 72 (Step S05).

Then, the inner pressure of the process chamber 20 is reduced from the first pressure P1 toward the second pressure P2 (Step S06).

<Pressure Reduction from Second Pressure to High Vacuum Range>

Subsequently, a step of further reducing the inner pressure of the process chamber 20 from the second pressure P2 to the high vacuum range (also referred to as a "step of adjusting the inner pressure of the process chamber 20 from the second pressure P2 to the process pressure") is performed.

Before the inner pressure of the process chamber 20 is reduced from the second pressure P2 to the high vacuum range, the atmospheric pressure sensor 64 and the first vacuum sensor 68 are turned off, the valve 66A is opened when the inner pressure of the process chamber 20 reaches the second pressure P2, and the second vacuum sensor 66 is turned on to detect whether the inner pressure of the process chamber 20 is reduced to the second pressure P2 (Step S07). Information whether or not the inner pressure of the process chamber 20 is reduced to the second pressure P2 or not is transmitted to the main controller 70, and in turn, is transmitted from the main controller 70 to the APC controller 72.

As shown in FIG. 3, when the inner pressure of the process chamber 20 is reduced to the second pressure P2, the first APC valve 58A and the gate valve 56 (561) are closed in response to the closing signal from the main controller 70. Simultaneously, the second APC valve 58B (581) is opened by the opening signal from the APC controller 72 while adjusting the opening degree of the second APC valve 58B (581) (Step S08).

Then, the inner pressure of the process chamber 20 is maintained at a predetermined process pressure from the second pressure P2 (Step S09). For example, the process pressure is a pressure at which a film-forming temperature is reached in a film-forming step described later. According to the present embodiments, as described later, the process pressure may not be in the high vacuum state and, may be higher than the second pressure P2. For example, after the inner pressure of the process chamber 20 is further reduced from the second pressure P2 to the high vacuum range, the inner pressure of the process chamber 20 may be adjusted again to the process pressure. In addition, after a leakage of the process chamber 20 is checked when the inner pressure of the process chamber 20 is reduced to the ultimate vacuum pressure, the inner pressure of the process chamber 20 may be adjusted again to the process pressure. In such a case, it is preferable that a purge gas such as the inert gas is supplied when adjusting the inner pressure of the process chamber 20 from the ultimate vacuum pressure to the process pressure.

Then, while the inner pressure of the process chamber 20 is maintained at the predetermined process pressure, the substrate 30 is processed (Step S10).

Subsequently, it is detected whether or not the substrate processing of the substrate 30 is completed (Step S10). When information that the substrate processing is completed is transmitted to the main controller 70 after the substrate processing is completed, the main controller 70 is operated such that the inert gas (for example, nitrogen gas) is supplied into the process chamber 20 and an inner atmosphere of the process chamber 20 is replaced by a nitrogen atmosphere (Step S11). Subsequently, the first APC valve 58A, the gate valve 56 and the second APC valve 58B are closed in accordance with the closing signal from the main controller 70 and the APC controller 72 such that the inner pressure of the process chamber 20 is increased. Thereby, the inner pressure of the process chamber 20 is returned to the atmospheric pressure. When the inner pressure of the process chamber 20 reaches a certain pressure (for example, an arbitrary pressure equal to or less than the atmospheric pressure), the main controller 70 may transmit an instruction for a desired pressure (for example, the atmospheric pressure) to the APC controller 72, and the APC controller 72 receiving the instruction may transmit the opening signal to the second APC valve 58B to open the second APC valve 58B. When opening the second APC valve 58B, it is preferable to control the second APC valve 58B (581) such that the inner pressure of the process chamber 20 reaches the atmospheric pressure while adjusting the opening degree of the second APC valve 58B, as described above with reference to FIG. 3 (Step S12).

Then, the processed substrates including the substrate 30 are discharged (unloaded) out of the process chamber 20.

In FIG. 5, a time duration between time points t and t' and a time duration between time points 5t and 5t', in which the inner pressure of the process chamber 20 is not reduced, indicate the amounts of time taken for switching the first APC valve 58A, the second APC valve 58B and the gate valve 56. However, the time durations illustrated in FIG. 5 are exaggerated to facilitate the understanding of switching the first APC valve 58A, the second APC valve 58B and the gate valve 56, and the actual time durations for switching the first APC valve 58A, the second APC valve 58B and the gate valve 56 are very short.

<Comparative Example>

In FIG. 5, a pressure reduction time of reducing the inner pressure of the process chamber 20 according to the comparative example is shown as the pressure reduction line "B". A diameter of a pipe and a flow rate of an APC valve of a bypass exhaust line according to the comparative example are smaller than the diameter of the pipe 54A and a flow rate of the second APC valve 58B of the bypass exhaust line 54 according to present embodiments, respectively. Specifically, the diameter of the pipe of the bypass exhaust line according to the comparative example is 0.2 times the diameter of a main exhaust line according to the comparative example. Therefore, in the pressure reduction line "B", the pressure reduction time of reducing the inner pressure of the process chamber 20 from the atmospheric pressure P0 to the first pressure P1 is about 5t, and the pressure reduction time of reducing the inner pressure of the process chamber 20 from the atmospheric pressure P0 to the second pressure P2 is about 10t.

On the other hand, according to the present embodiments, as described above, the diameter of the pipe 54A of the bypass exhaust line 54 is 0.5 times to 0.9 times the diameter D of the pipe 52A of the main exhaust line 52. Therefore, according to the present embodiments, as shown by the pressure reduction line "A" in FIG. 5, the pressure reduction time of reducing the inner pressure of the process chamber 20 from the atmospheric pressure P0 to the first pressure P1 is about t, and the pressure reduction time of reducing the inner pressure of the process chamber 20 from the atmospheric pressure P0 to the second pressure P2 is about 5t. In a pressure range of the high vacuum range below the second pressure P2, it is extremely difficult to further reduce the inner pressure of the process chamber 20 according to the comparative example as shown by the pressure reduction line "B". However, according to the present embodiments, since a pressure reduction efficiency of the bypass exhaust line 54 is higher than that of the bypass exhaust line according to the comparative example, it is possible to further reduce the inner pressure of the process chamber 20 into the high vacuum range. Therefore, it is possible to perform the substrate processing (for example, a film-forming process) in a high vacuum state.

As described above, according to the present embodiments, when the inner pressure of the process chamber 20 is reduced to the predetermined vacuum state, the main controller 70 adjusts the opening degree of the second APC valve 58B of the bypass exhaust line 54 to reduce the inner pressure of the process chamber 20 to the first pressure P1.

Here, since the diameter of the pipe 54A of the bypass exhaust line 54 is 0.4 times to 0.9 times the diameter of the pipe 52A of the main exhaust line 52, an exhaust amount according to the present embodiments is not smaller than an exhaust amount according to the comparative example. Therefore, it is possible to shorten the pressure reduction time of reducing the inner pressure of the process chamber 20 to the first pressure P1 as compared with a substrate processing apparatus according to the comparative example. In addition, since the opening degree of the second APC valve 58B is adjusted to reduce the inner pressure of the process chamber 20, it is possible to suppress the diffusion of the particles in the process chamber 20 as compared with a case where the gate valve 56 and the first APC valve 58A of the main exhaust line 52 are opened to perform an initial exhaust.

When the inner pressure of the process chamber 20 is reduced to the first pressure P1, by closing the second APC valve 58B and opening the gate valve 56 and the first APC valve 58A, the gas in the process chamber 20 is exhausted through the main exhaust line 52 including the pipe 52A. Thereby the exhaust amount per unit time is increased, and the pressure reduction time of reducing the inner pressure of the process chamber 20 to the second pressure P2 can be shortened. That is, since the pressure reduction time of reducing the inner pressure of the process chamber 20 to the high vacuum state can be shortened, the present embodiments can be applied to the substrate processing performed in a high vacuum state, which is recently more in use.

When the inner pressure of the process chamber 20 is reduced to the second pressure P2, the gate valve 56 and the first APC valve 58A are closed, the second APC valve 58B is opened, and the inner pressure of the process chamber 20 is further reduced into the high vacuum range of a higher vacuum degree. Since a responsiveness of the second APC valve 58B is higher than that of the gate valve 56 or that of the first APC valve 58A, and the diameter of the pipe 54A of the bypass exhaust line 54 is smaller than the diameter of the pipe 52A of the main exhaust line 52, it is possible to achieve the high vacuum state without an air leakage.

<Substrate Processing>

Hereinafter, a substrate processing method including a predetermined process, which is performed by using the substrate processing apparatus 100 according to the present embodiments, will be described. For example, the predetermined process will be described by way of an example in which the substrate processing serving as a part of manufacturing processes of the semiconductor device is performed as the predetermined process.

When performing the substrate processing, the process recipe is loaded in a component such as a memory (not shown). Then, the main controller 70 transmits a control instruction to the APC controller 72 and transmits an operation instruction to a process system controller (not shown) or a transfer system controller (not shown). The substrate processing performed as described above includes at least a loading step, a film-forming step and an unloading step.

<Transfer Step>

The main controller 70 controls a substrate transfer device (which is a substrate transfer mechanism, not shown) to start a transfer process of transferring (loading) the substrate 30 to the boat 26. The transfer process is performed until the substrates scheduled to be loaded into the boat 26 including the substrate 30 are completely loaded into the boat 26 (wafer charging).

<Loading Step>

When a predetermined number of the substrates (that is, the plurality of the substrates including the substrate 30) are loaded into the boat 26, the boat 26 is elevated by the boat elevator (not shown), and is loaded into the process chamber 20 provided in the reaction furnace 10 (boat loading). When the boat 26 is completely loaded into the process chamber 20, the furnace opening lid 28 airtightly closes the lower end of the furnace opening flange 14 of the reaction furnace 10.

<Film-Forming Step>

Thereafter, the inner atmosphere of the process chamber 20 is vacuum-exhausted by a vacuum exhaust device (not shown) such as a vacuum pump (not shown) in accordance with an instruction from the APC controller 72 such that the inner pressure of the process chamber 20 reaches the predetermined process pressure (vacuum degree). In addition, the process chamber 20 is heated by the heater 18 in accordance with an instruction from a temperature controller (not shown) such that an inner temperature of the process chamber 20 reaches a predetermined process temperature. Subsequently, the boat 26 and the plurality of the substrates including the substrate 30 accommodated in the boat 26 are rotated by a rotator (which is a rotating mechanism, not shown). While the inner pressure of the process chamber 20 is maintained at the predetermined process pressure and the inner temperature of the process chamber 20 is maintained at the predetermined process temperature, a predetermined gas such as a process gas is supplied to the plurality of the substrates including the substrate 30 accommodated in the boat 26 in order to perform the predetermined process (for example, the film-forming process) to the substrate 30. The inner temperature of the process chamber 20 may be lowered from the process temperature (that is, the predetermined process temperature) before the performing the unloading step.

<Unloading Step>

After the film-forming step to the substrate 30 accommodated in the boat 26 is completed, the rotator stops the rotation of the boat 26 and the plurality of the substrates including the substrate 30 accommodated in the boat 26. Then, the inner atmosphere of the process chamber 20 is replaced by the nitrogen atmosphere (nitrogen substitution step), and the inner pressure of the process chamber 20 is returned to the atmospheric pressure. The furnace opening lid 28 is lowered in order to open the lower end of the furnace opening flange 14. The boat 26 with the processed substrates including the substrate 30 accommodated therein are then transferred (unloaded) out of the reaction furnace 10 (boat unloading).

<Collection Step>

Thereafter, the boat 26 with the processed substrates including the substrate 30 accommodated therein is very effectively cooled by clean air ejected from a clean air supplier (which is a clean air supply mechanism, not shown). For example, when the boat 26 is cooled to 150° C. or lower, the processed substrates including the substrate 30 are transferred (discharged) from the boat 26 (wafer discharging) to a pod (not shown). When a batch processing is continuously performed, other unprocessed substrates may be transferred to the boat 26.

As described above, according to the present embodiments, the inner atmosphere of process chamber 20 is vacuum-exhausted in at least one among the step of reducing the inner pressure of the process chamber 20 from the atmospheric pressure P0 to the first pressure P1, the step of reducing the inner pressure of the process chamber 20 from the first pressure P1 to the second pressure P2 and the step of adjusting the inner pressure of the process chamber 20 from the second pressure P2 to the process pressure. In addition, the purge gas may be supplied in at least one among the steps described above while the inner atmosphere of process chamber 20 is vacuum-exhausted.

As described above, according to the present embodiments, two vacuum sensors (that is, the first vacuum sensor 68 and the second vacuum sensor 66) are used to detect the inner pressure of the process chamber 20 in the step of reducing the inner pressure of the process chamber 20 from the atmospheric pressure P0 to the first pressure P1, the step of reducing the inner pressure of the process chamber 20 from the first pressure P1 to the second pressure P2 and the step of adjusting the inner pressure of the process chamber 20 from the second pressure P2 to the process pressure. However, a vacuum sensor "A" may be used to detect the inner pressure of the process chamber 20 in the step of reducing the inner pressure of the process chamber 20 from the atmospheric pressure P0 to the first pressure P1, a vacuum sensor "B" may be used to detect the inner pressure of the process chamber 20 in the step of reducing the inner pressure of the process chamber 20 from the first pressure P1 to the second pressure P2, and a vacuum sensor "C" may be used to detect the inner pressure of the process chamber 20 in the step of adjusting the inner pressure of the process chamber 20 from the second pressure P2 to the process pressure in a high vacuum state.

As described above, according to the present embodiments, since the inner pressure of the process chamber 20 is reduced from the pressure near the atmospheric pressure to a certain negative pressure (for example, the first pressure) while adjusting the opening degree of the APC valve, it is possible to adjust the inner pressure of the process chamber 20 into a high vacuum state in a short time without diffusing the particles in the process chamber 20.

<Other Embodiments>

While the embodiments of the technique described above is mainly described by way of an example in which the process pressure is lower than the second pressure P2, the technique is not limited thereto. The process pressure may be higher than the second pressure P2. Hereinafter, other embodiments where the process pressure is higher than the second pressure P2 will be described. Since the step of reducing the inner pressure of the process chamber 20 from the atmospheric pressure to the first pressure P1 according to the other embodiments is the same as described above, and a description thereof will be omitted. According to the other embodiments, when the inner pressure of the process chamber 20 reaches the first pressure P1, the inner atmosphere of the process chamber 20 is exhausted to reduce the inner pressure of the process chamber 20 through the pipe 52A of the main exhaust line 52 by closing the second APC valve 58B and opening the gate valve 56 while adjusting the opening degree of the first APC valve 58A such that the inner pressure of the process chamber 20 reaches the process pressure.

Alternatively, when the inner pressure of the process chamber 20 is reduced to a certain pressure by opening the first APC valve 58A according to the process pressure, the opening degree of the first APC valve 58A may be adjusted such that the inner pressure of the process chamber 20 reaches the process pressure. The certain pressure reduced by opening the first APC valve 58A may be higher or lower than the process pressure because it may be reduced to a pressure near the process pressure.

Even in the other embodiments, since the inner pressure of the process chamber 20 is reduced from the pressure near the atmospheric pressure to the certain negative pressure (for example, the first pressure) while adjusting the opening degree of the APC valve, it is possible to adjust the inner pressure of the process chamber into the process pressure in a short time without diffusing the particles in the process chamber.

According to some embodiments in the present disclosure, it is possible to adjust the inner pressure of the process chamber into a high vacuum state in a short time without diffusing the particles in the process chamber.

What is claimed is:

1. A substrate processing apparatus comprising:
   a process chamber in which a substrate is processed;
   a main exhaust line comprising:
      a first pipe configured to discharge a gas from the process chamber;
      a first opening degree adjusting valve provided at the first pipe;
      an opening/closing valve provided at the first pipe; and
      a pressure sensor provided at the first pipe and configured to detect an inner pressure of the process chamber;
   a bypass exhaust line comprising:
      a second pipe connected to the main exhaust line; and
      a second opening degree adjusting valve provided at the second pipe; wherein a diameter of the second pipe is less than that of the first pipe and
   a controller configured to adjust the inner pressure of the process chamber to a process pressure by performing:
      (a) reducing the inner pressure of the process chamber from an atmospheric pressure to a first pressure via the bypass exhaust line, by adjusting an opening degree of the second opening degree adjusting valve based on information from the pressure sensor;
      (b) reducing the inner pressure of the process chamber to a second pressure lower than the first pressure via the bypass exhaust line, by closing the second opening degree adjusting valve and opening the opening/closing valve and the first opening degree adjusting valve when the inner pressure of the process chamber reaches the first pressure; and
      (c) when the process pressure is lower than the second pressure, adjusting the inner pressure of the process chamber to the process pressure by closing the first opening degree adjusting valve and the opening/closing valve and opening the second opening degree adjusting valve while adjusting the opening degree of the second opening degree adjusting valve; and when the process pressure is higher than the second pressure, adjusting the inner pressure of the process chamber to the process pressure by adjusting an opening degree of the first opening degree adjusting valve.

2. The substrate processing apparatus of claim 1, wherein the pressure sensor comprises a first vacuum sensor and a second vacuum sensor, the inner pressure of the process chamber is reduced to the second pressure based on information from the first vacuum sensor in (b), and the inner pressure of the process chamber is adjusted from the second pressure to the process pressure based on information from the second vacuum sensor in (c).

3. The substrate processing apparatus of claim 1, wherein the opening/closing valve and the first opening degree adjusting valve are closed in (a).

4. The substrate processing apparatus of claim 3, wherein an opening degree of the first opening degree adjusting valve is maintained at 0% in (a).

5. The substrate processing apparatus of claim 1, wherein an opening degree of the first opening degree adjusting valve is maintained at 100% in (b).

6. The substrate processing apparatus of claim 1, wherein a ratio of a diameter of the first pipe to a diameter of the second pipe is 1.0:0.2 or more and 1.0:0.8 or less.

7. The substrate processing apparatus of claim 1, wherein a diameter of the second pipe is 80 mm or more and 100 mm or less.

8. The substrate processing apparatus of claim 1, wherein a purge gas is supplied in at least one among (a), (b) and (c).

9. The substrate processing apparatus of claim 1, wherein, when the process pressure is less than the second pressure, the inner pressure of the process chamber is adjusted to the process pressure by: reducing the inner pressure of the process chamber to a vacuum pressure less than the second pressure; and adjusting the inner pressure of the process chamber from the vacuum pressure to the process pressure by adjusting the opening degree of the second opening degree adjusting valve while supplying a purge gas.

* * * * *